US010998487B1

(12) United States Patent
Miesner et al.

(10) Patent No.: US 10,998,487 B1
(45) Date of Patent: May 4, 2021

(54) LINEAR MAGNETOSTRICTIVE ACTUATOR

(71) Applicant: The United States of America, as represented by the Secretary of the Navy, Arlington, VA (US)

(72) Inventors: John E. Miesner, Fairfax, VA (US); George G. Zipfel, Jr., Summit, NJ (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 50 days.

(21) Appl. No.: 16/136,742

(22) Filed: Sep. 20, 2018

Related U.S. Application Data

(60) Provisional application No. 62/564,100, filed on Sep. 27, 2017.

(51) Int. Cl.
*H01L 41/12* (2006.01)
*H01L 41/20* (2006.01)
*H01L 41/06* (2006.01)

(52) U.S. Cl.
CPC .............. *H01L 41/12* (2013.01); *H01L 41/06* (2013.01); *H01L 41/20* (2013.01)

(58) Field of Classification Search
CPC ......... H01L 41/12; H01L 41/06; H01L 41/20; H01F 7/08; H01F 7/1615; H02K 15/00; H02K 1/146; H02K 1/276; H02K 33/16; H02K 41/0356; H02K 99/20
See application file for complete search history.

(56) References Cited

U.S. PATENT DOCUMENTS

| 5,451,821 | A | 9/1995 | Teter et al. | |
| 5,587,615 | A | 12/1996 | Murray et al. | |
| 6,891,286 | B2 | 5/2005 | Flanagan et al. | |
| 7,323,960 | B2* | 1/2008 | Maruyama | H01L 41/12 251/129.06 |
| 7,504,921 | B2* | 3/2009 | Vranish | H01F 7/08 335/212 |
| 8,487,487 | B2* | 7/2013 | Dietz | B06B 1/08 310/26 |

(Continued)

OTHER PUBLICATIONS

U.S. Appl. No. 15/717,658, entitled "Magnetostrictive Actuator With Center Bias," filed Sep. 27, 2017, inventor John E. Miesner.

(Continued)

*Primary Examiner* — Bernard Rojas
(74) *Attorney, Agent, or Firm* — Howard Kaiser

(57) ABSTRACT

Exemplary practice of the present invention provides a magnetostrictive actuator characterized by linear force output and uniform magnetic biasing. A center bias magnet drives flux through series magnetostrictive bars in opposite directions while surrounding drive coils apply flux in the same direction through the bars. The net response is substantially linear with respect to the drive coil current. A second parallel set of magnetostrictive bars completes the flux path and adds to the actuator output force. Flux leakage between the parallel bars is compensated by a ferromagnetic shunt or by a tapered magnet providing uniform flux density down the length of the magnetostrictive bars. The closed flux path allows magnetic shielding of the entire actuator, if desired.

14 Claims, 15 Drawing Sheets

(56) References Cited

U.S. PATENT DOCUMENTS

| | | |
|---|---|---|
| 10,175,306 B1 | 1/2019 | Miesner |
| 10,848,044 B1 | 11/2020 | Miesner |
| 2003/0057394 A1* | 3/2003 | Makino .............. F02M 63/0225 251/129.06 |
| 2018/0062491 A1 | 3/2018 | Miesner |

OTHER PUBLICATIONS

U.S. Appl. No. 62/564,100, entitled "Linear Magnetostrictive Actuator," filed Sep. 27, 2017, joint inventors John E. Miesner and George G. Zipfel Jr.

U.S. Appl. No. 15/675,901, entitled "Linear Electromagnetic Actuator," filed Aug. 14, 2017, inventor John E. Miesner.

USPTO non-final Office action dated Mar. 19, 2020, U.S. Appl. No. 15/675,901, entitled "Linear Electromagnetic Actuator," filed Aug. 14, 2017, inventor John E. Miesner; 33 pages total, including cover sheet, Office action summary, non-final rejection, notice of references cited, considered IDS, and examiner's search notes/history.

USPTO non-final Office action (election/restriction requirement) dated Dec. 26, 2019, U.S. Appl. No. 15/717,658, entitled "Magnetostrictive Actuator With Center Bias," filed Sep. 27, 2017, inventor John E. Miesner, 6 pages.

Applicant's Preliminary Amendment (12 pages) and Response to Restriction/Election Requirement (3 pages), filed Mar. 22, 2020, U.S. Appl. No. 15/717,658, entitled "Magnetostrictive Actuator With Center Bias," filed Sep. 27, 2017, inventor John E. Miesner.

USPTO notice of allowance dated Oct. 28, 2020 (with attachments including notice of allowability, search notes, issue classification, EAST search history, and bibliographic data), 17 pages, U.S. Appl. No. 15/717,658, entitled "Magnetostrictive Actuator With Center Bias," filed Sep. 27, 2017, inventor John E. Miesner.

Amendment filed in the USPTO dated Oct. 16, 2020, 13 pages, U.S. Appl. No. 15/717,658, entitled "Magnetostrictive Actuator With Center Bias," filed Sep. 27, 2017, inventor John E. Miesner.

* cited by examiner

LINEAR MAGNETOSTRICTIVE ACTUATOR

CROSS-REFERENCE TO RELATED APPLICATIONS

This application claims the benefit of U.S. provisional application No. 62/564,100, filed 27 Sep. 2017, hereby incorporated herein by reference, entitled "Linear Magnetostrictive Actuator," joint inventors John E. Miesner and George G. Zipfel.

STATEMENT OF GOVERNMENT INTEREST

The invention described herein may be manufactured and used by or for the Government of the United States of America for governmental purposes without payment of any royalties thereon or therefor.

BACKGROUND OF THE INVENTION

The present invention relates to magnetostrictive actuators, more particularly to magnetostrictive actuators that seek to produce a linear force output and/or a uniform magnetic bias flux in the magnetostrictive elements.

Magnetostrictive actuators offer great promise for applications that require a high force output over a wide bandwidth. However, magnetostrictive materials have two characteristics that limit their use. The first limiting characteristic is the inherent nonlinear material response in strain to magnetic flux density. Many applications require a linear force output that has not been achieved by the current art for magnetostrictive actuators. The second limiting characteristic is the relatively low permeability of magnetostrictive materials insofar as it makes it difficult to achieve a uniform magnet bias down the length of the magnetostrictive element due to flux leakage.

U.S. Pat. No. 5,451,821 to Teter et al., incorporated herein by reference, teaches a method of compensating for magnetic flux leakage using magnets outside the drive coils to apply a magnetic field perpendicular to the desired bias direction. Teter et al.'s method has proven to be effective and has been widely adopted in the design of magnetostrictive actuators. However, the perpendicular magnets required by Teter et al. are relatively large, thus increasing the size and cost of an actuator using this method. The perpendicular magnets also cause large magnetic fields external to the actuator, which are not acceptable in many applications. These external fields cannot be effectively shielded by the usual method of surrounding the entire actuator with a ferromagnetic case, because doing so would short out the perpendicular magnet flux.

U.S. Pat. No. 6,891,286 to Flanagan et al., incorporated herein by reference, teaches large axially polarized disk magnets at each end of a magnetostrictive rod to achieve a uniform magnetic flux down the length of the rod. However, this approach of Flanagan et al. does nothing to address the inherent nonlinear material response, requires large magnets, and has large external magnetic fields.

SUMMARY OF THE INVENTION

In view of the foregoing, it is an object of the present invention to provide a magnetostrictive actuator having linear force output and uniform magnetic biasing in the magnetostrictive elements.

An exemplary embodiment of the present invention is a magnetostrictive actuator that uses parallel bars so as to produce an at least substantially linear force output concomitant with compensation for flux leakage, thereby allowing for enhanced length as compared with the current state of the art. Exemplary inventive practice achieves linear force output and uniform magnetic biasing through inventive implementation of a relatively small bias magnet in a closed flux loop without significant external fields. An exemplary parallel bar magnetostrictive actuator in accordance with the present invention produces a linear force output using a center bias magnet, and provides compensation for flux leakage using a ferromagnetic shunt or a tapered permanent magnet.

U.S. Pat. No. 5,587,615 to Murray et al., incorporated herein by reference, teaches a method to linearize the output of a magnetic actuator with force generated across air gaps. Murray arranges two air gaps with the total actuator force equal to the difference of the forces across them, and then establishes (i) magnetic bias flux in opposite directions in the two air gaps and (ii) coil flux in the same direction in the two air gaps. Therefore, as coil flux increases it tends to cancel the bias flux in one gap and add to the bias flux in the other gap.

The inherent force generated across an air gap is quadratic with respect to the total flux across the gap. If the bias flux is $\Phi_{bias}$ and the coil flux is $\Phi_{coil}$, then the force in one gap can be written as $F=k (\Phi_{bias} \pm \Phi_{coil})^2$, where k is a proportionality constant dependent on the geometry. The net force in the two gaps can be written as $F_{net}=k [(\Phi_{bias}+\Phi_{coil})^2 - (\Phi_{bias}-\Phi_{coil})^2]$. Simplifying this equation yields $F_{net}=4k \Phi_{bias}\Phi_{coil}$. Thus, the net output force is linear with respect to the coil flux.

By doping iron with gallium, U.S. Navy researchers created Galfenol, a material that has higher magnetic permeability than other giant magnetostrictive materials and that can withstand high tensile stress that would cause other materials to fail. Tensile stress allows longer magnetostrictive elements to be used in an actuator, as compared to compressive stress, because tension eliminates buckling as a mode of failure.

The present inventors recognize that the higher magnetic permeability of Galfenol enables an actuator with a parallel bar arrangement in which magnetic flux from surrounding coils is conducted up one Galfenol bar, across a ferromagnetic link, down a parallel Galfenol bar, and then across another ferromagnetic link back to the first bar in a complete loop. The parallel bar arrangement eliminates the need for a separate dedicated magnetic flux return, making the resulting actuator more compact. However, current art for magnetic biasing of parallel bar Galfenol-type actuators is to use external magnets with the attendant size, cost, and external magnetic field problems. Also, the maximum actuator length, although greatly enhanced, is still limited by flux leakage.

The present inventors also recognize that the response of a magnetostrictive material such as Galfenol is substantially quadratic with respect to magnetic flux through the material up to the flux level at which it begins to saturate. The present invention uses this quadratic response characteristic to produce a linear net output force in a manner analogous to the method of Murray. In accordance with exemplary inventive practice, a center bias magnet drives flux through series magnetostrictive bars in opposite directions, while surrounding drive coils apply flux in the same direction through the bars. A second parallel set of magnetostrictive bars completes the flux path. The force output connection is between the series bars and therefore the net output is the difference of the force generated in them. The output force is linear over the flux range for which the magnetostrictive material response is quadratic.

As exemplarily practiced, the present invention compensates for flux leakage between the parallel bars by either of two inventive methods. The first inventive method for flux leakage compensation includes implementation of ferromagnetic shunts between the magnetostrictive bars that conduct flux parallel to the bars at the same rate as the leakage flux. Therefore, there is no net change in bar flux down the length the bar. The second inventive method for flux leakage compensation includes implementation of tapered permanent magnets between the bars polarized perpendicular to the bars. The magnets inject flux into the bars at the same rate as the leakage flux. Again, there is no net change in bar flux down the length of the bar.

Inventive application of either flux leakage compensation method is optional, depending on the magnetic permeability of the material used and the distance between the parallel bars as compared to the length of the bars (e.g., wherein each bar has the same length). As a general rule for Galfenol, acceptable performance may be inventively achieved without flux leakage compensation, as long as the bar length is less than about four times the bar separation distance.

Various preferred modes of practicing the present invention include what are referred to herein as a "first" mode of inventive practice, a "second" mode of inventive practice, a "third" mode of inventive practice, and a "fourth" mode of inventive practice.

The first mode of inventive practice uses ferromagnetic links between series magnetostrictive bars to conduct flux from the permanent magnet into the ends of the bars, and uses the ferromagnetic shunt method of flux leakage compensation.

The second mode of inventive practice uses the same ferromagnetic link and series bar arrangement as the first inventive mode, but uses the tapered permanent magnet method of flux leakage compensation.

The third mode of inventive practice uses continuous magnetostrictive bars, rather than series magnetostrictive bars with a ferromagnetic link therebetween. The flux from the permanent magnet enters the side of the bar at the center. This third inventive mode uses the same ferromagnetic shunt method of flux leakage compensation as the first inventive mode.

The fourth mode of inventive practice uses the same continuous magnetostrictive bar arrangement as the third inventive mode, and the same tapered permanent magnet method of flux leakage compensation as the second inventive mode.

This United States patent application is related to U.S. patent application Ser. No. 15/717,658, hereby incorporated herein by reference, filed 27 Sep. 2017, entitled "Magnetostrictive Actuator with Center Bias," sole inventor John E. Miesner.

BRIEF DESCRIPTION OF THE DRAWINGS

The present invention will now be described, by way of example, with reference to the accompanying drawings, wherein like numbers indicate same or similar parts or components, and wherein.

DESCRIPTION OF EXEMPLARY EMBODIMENTS OF THE INVENTION

Figure 1:
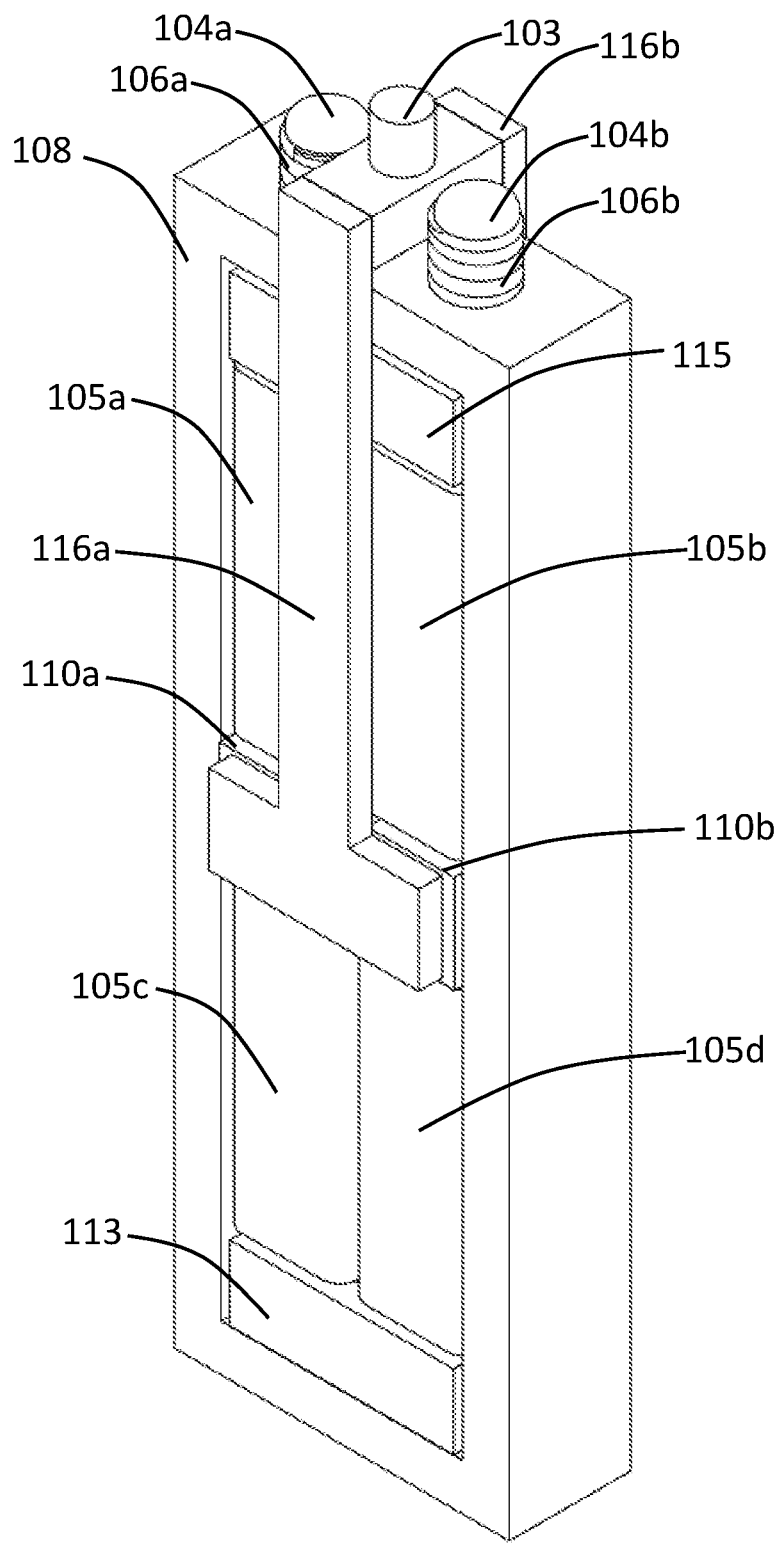
FIG. 1 is a perspective view that may be conceived to be externally representative, by way of example, of any of the first, second, third, and fourth modes of practice of the present invention.
Figure 2:
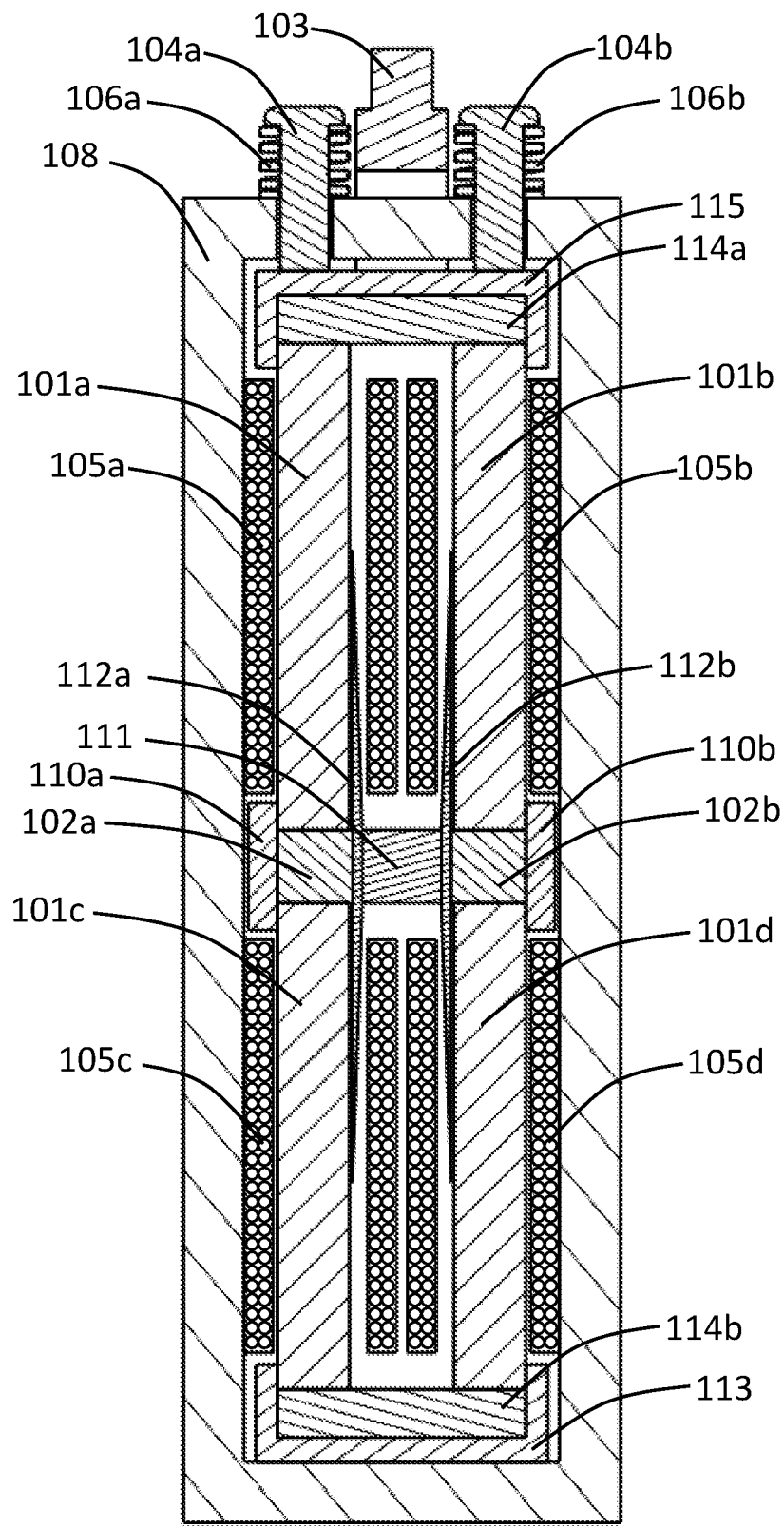
FIG. 2 is a cross-sectional view of an embodiment exemplary of the first mode of practice of the present invention.
Figure 3:
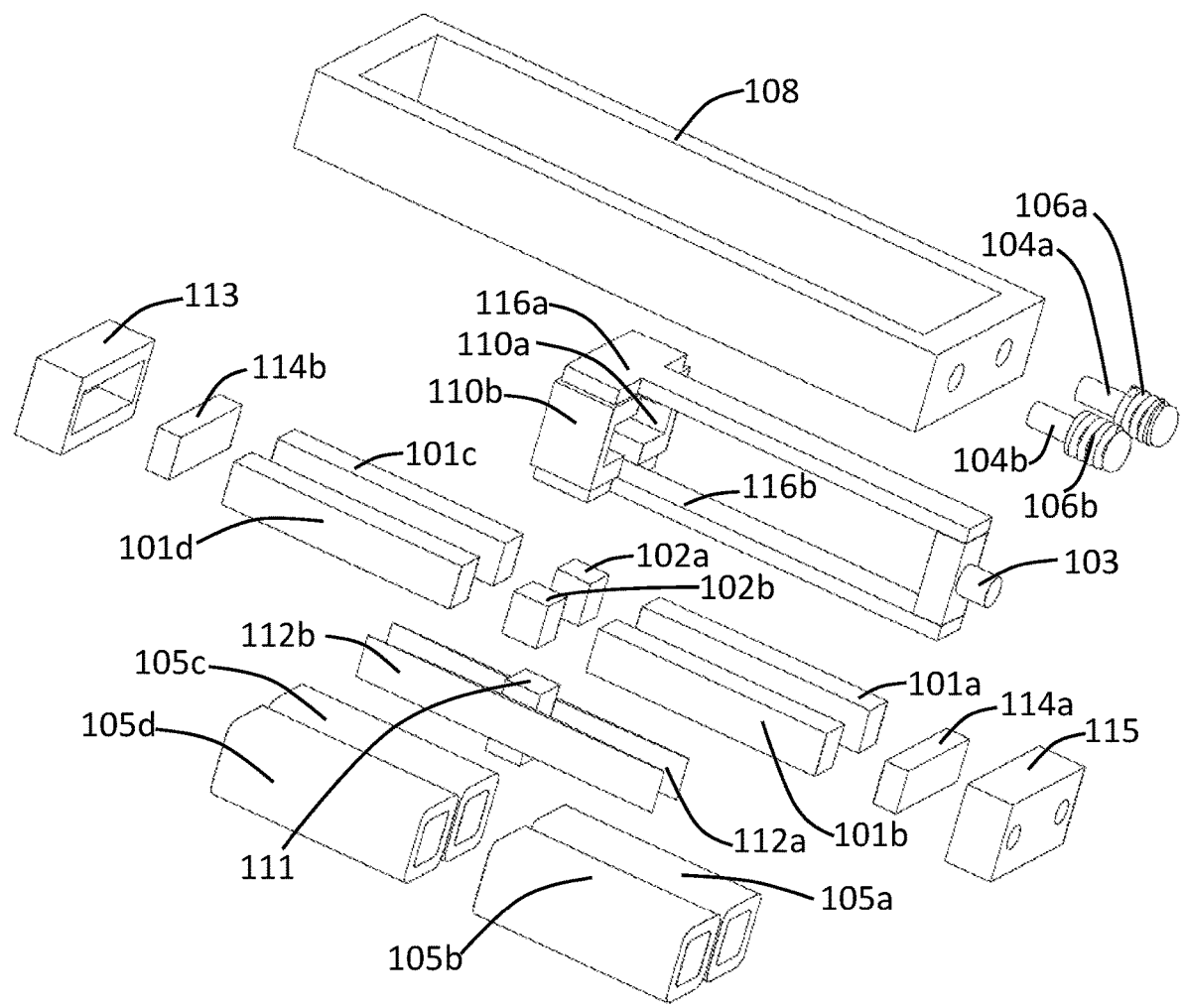
FIG. 3 is an exploded view of the inventive first-mode embodiment shown in FIG. 2.

FIG. 1, FIG. 2, and FIG. 3 are three different views of an embodiment in accordance with the first mode of practice of the present invention. Top left and bottom left magnetostrictive bars 101*a* and 101*c*, respectively, are each connected to left center support 110*a*. Top right and bottom right magnetostrictive bars 101*b* and 101*d*, respectively, are each connected to right center support 110b. Center supports 110a and 110b are both attached to output links 116a and 116b, which are attached to output shaft 103. Therefore changes in length of the magnetostrictive bars 101a, 101b, 101c, and 101d correspondingly move output shaft 103 with respect to support frame 108, thereby producing useful work. Center supports 110a and blob, output links 116a and 116b, and frame 108 are preferably made of a non-magnet high strength material such as stainless steel. The attachment to the magnetostrictive bars may be, for instance, by bonding or welding or may be mechanical.

Top left and bottom left magnetostrictive bars 101a and 101c are each in contact with left ferromagnetic link 102a while top right and bottom right magnetostrictive bars 101b and 101d are each in contact with right ferromagnetic link 102b. Top left and top right magnetostrictive bars 101a and 101b are each in contact with top ferromagnetic link 114a while bottom left and bottom right magnetostrictive bars 101c and 101d are each in contact with bottom ferromagnetic link 114b. Therefore, a closed magnetic flux conducting loop is formed by magnetostrictive bars 101a, 101b, 101c, and 101d and ferromagnetic links 102a, 102b, 114a, and 114b.

Each magnetostrictive bar is surrounded by a drive coil. Drive coil 105a surrounds magnetostrictive bar 101a; drive coil 105b surrounds magnetostrictive bar 101b; drive coil 105c surrounds magnetostrictive bar 101c; and drive coil 105d surrounds magnetostrictive bar 101d. The drive coils are all wired in a combination of series or parallel as desired such that each coil carries the same amount of current and the flux adds around the flux conducting loop. Thus, left magnetostrictive bars 101a and 101c always have drive coil flux in same direction, and right magnetostrictive bars 101b and 101d also always have drive coil flux in the same direction.

Bias magnet 111 is polarized in the transverse direction and is in contact with left and right ferromagnetic shunts 112a and 112b, which are in contact with left and right ferromagnetic links 102a and 102b, respectively. Magnetic flux will flow from one end of bias magnet 111 back to the other end with essentially equal flux following an upward loop which includes top magnetostrictive bars 101a and 101b, and a downward loop which includes bottom magnetostrictive bars 101c and 101d. Thus, left magnetostrictive bars 101a and 101c have bias flux in opposite directions from each other, and right magnetostrictive bars 101b and 101d also have bias flux in opposite directions from each other.

Optimum actuator output is obtained whenever the magnetostrictive bars 101a, 101b, 101c, and 101d are under preload tension. In the first mode of practice of the present invention, this tension is provided by preload springs 106a and 106b, which press upward on preload bolts 104a and 104b, respectively. Preload bolts 104a and 104b are connected to top support 114, which is connected to top magnetostrictive bars 101a and 101b. Bottom magnetostrictive bars 101c and 101c1 are connected to bottom support 113, which is connected to frame 108. Thus, the total preload is transferred from the top to the bottom of frame 108. Top and bottom supports 114 and 113 are preferably made of non-magnet high strength material such as stainless steel. The attachment to the magnetostrictive bars may be by bonding or welding or may be mechanical. Note that in inventive practice many other methods of applying a tensile bar stress are possible, depending on the magnetostrictive bar length and cross-section. For example, with relatively long and thin bars the preload springs 106a and 106b are usually not required, and load can be applied directly between the frame 108 and top support 114. In this case, the magnetostrictive bars themselves serve as the compliant elements.

Figure 4:
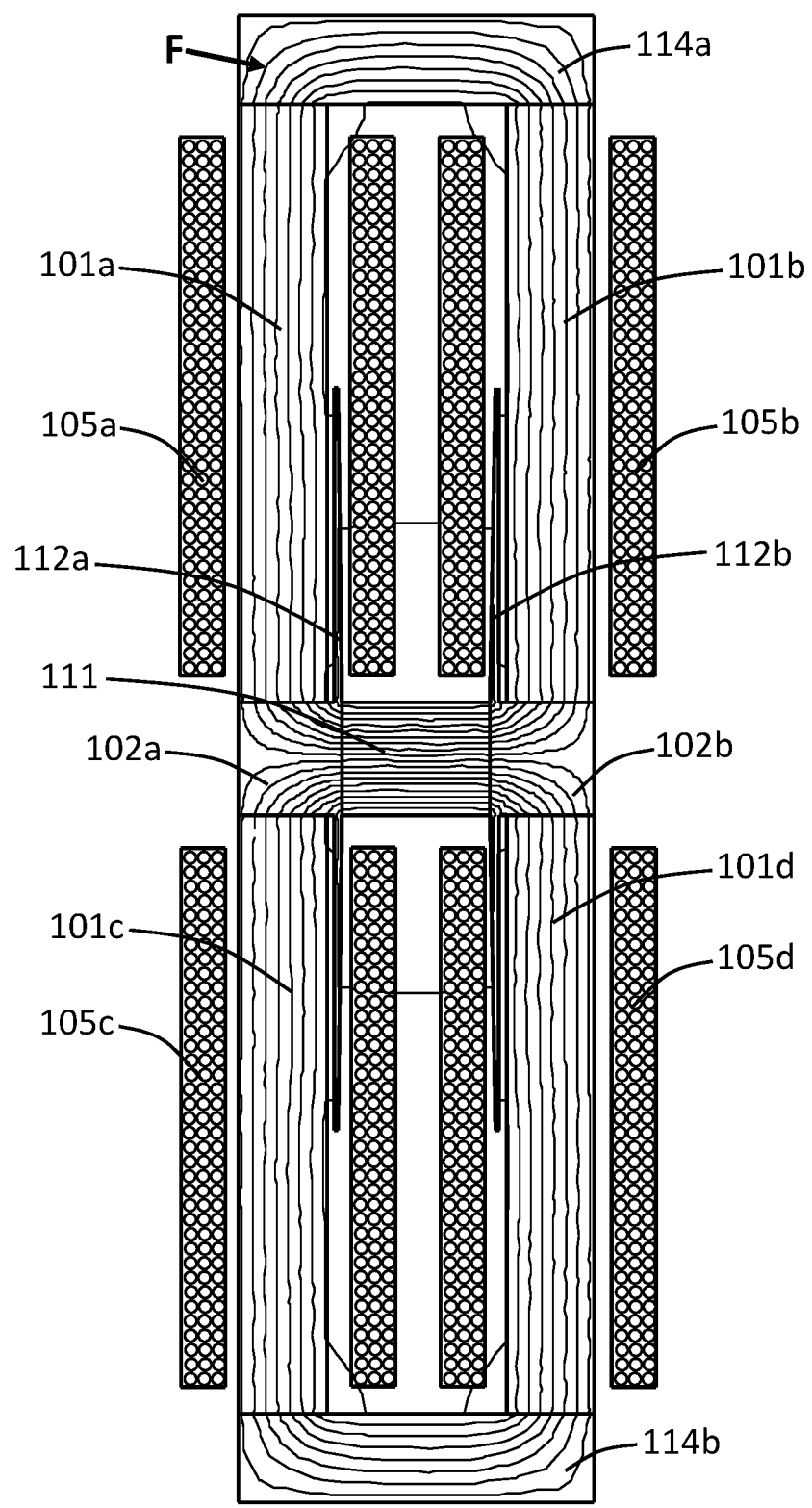
FIG. 4 is a diagram showing an example of the calculated magnetic flux lines with no drive current, for the inventive first-mode embodiment shown in FIG. 2.

FIG. 4 shows an example of a two-dimensional magnetic model of the first mode of practice of the present invention under condition of no current flow through the drive coils. The magnetostrictive material is Galfenol for the example shown in FIG. 4. The calculated magnetic flux paths are illustrated by lines F. With no drive coil current flow, all flux lines F flow from bias magnet 111 and form closed upper and lower loops back to bias magnet 111. It can be seen in FIG. 4 that left magnetostrictive bars 101a and 101c have bias flux in opposite directions from each other, and right magnetostrictive bars 101b and 101c1 also have bias flux in opposite directions from each other.

Figure 5:
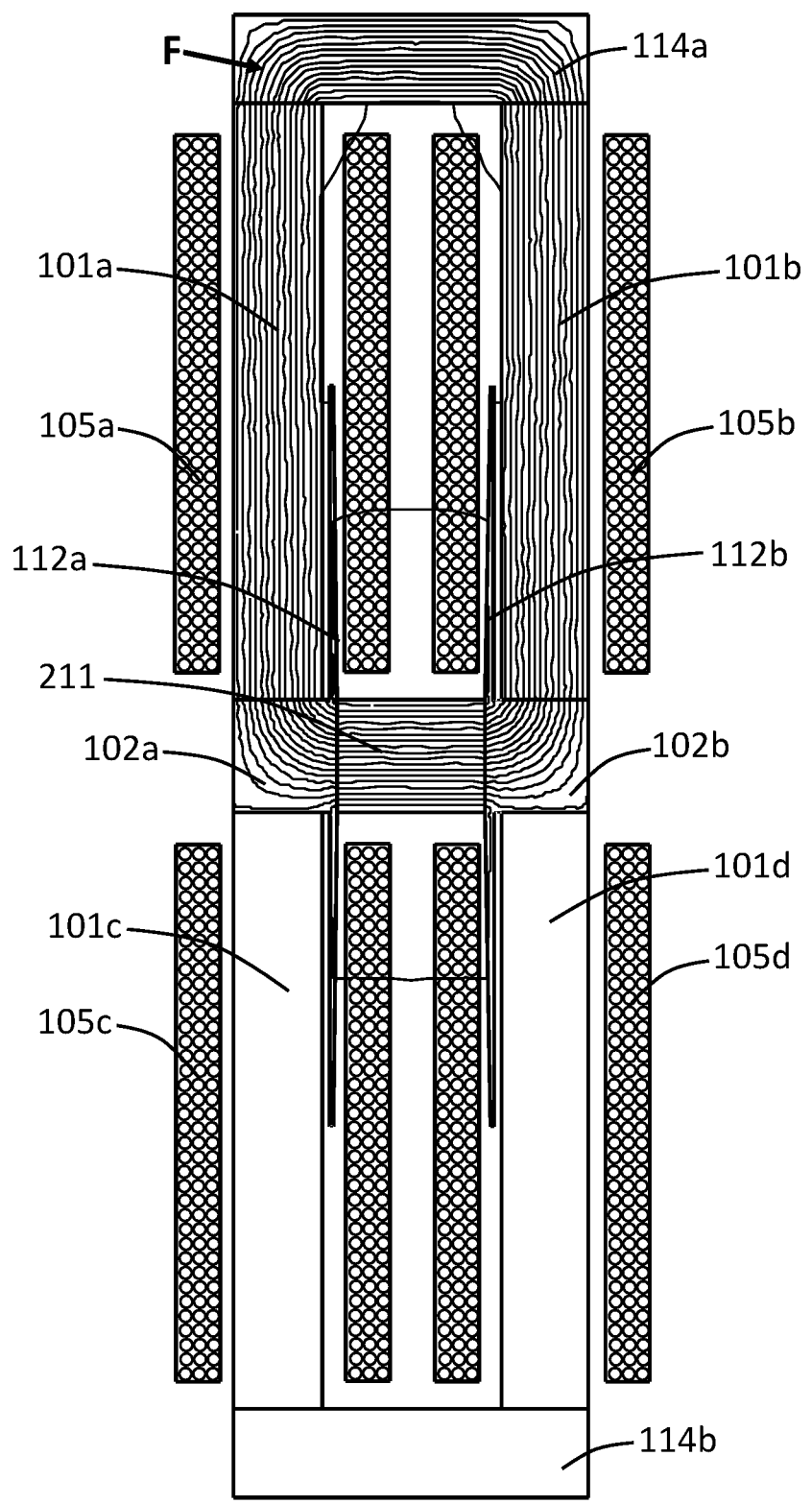
FIG. 5 is a diagram, similar to FIG. 4, showing an example of the calculated magnetic flux lines at maximum drive current, for the inventive first-mode embodiment shown in FIG. 2.

FIG. 5 shows the same two-dimensional magnetic model as FIG. 4 but under condition of maximum rated current flow through the drive coils. In the example shown in FIG. 5, the magnetic fluxes from the drive coils and from bias magnet 111 reinforce in the top magnetostrictive bars 101a and 101b and cancel in the bottom magnetostrictive bars 101c and 101d. Thus, the top magnetostrictive bars 101a and 101b elongate and the bottom magnetostrictive bars 101c and 101d shorten with respect to the no drive current condition moving center supports 102a and 102b in the downward direction. If the direction of current flow is reversed, then the magnetic flux from the drive coils and from bias magnet 111 will cancel in the top magnetostrictive bars 101a and 101b and reinforce in the bottom magnetostrictive bars 101c and 101d, moving center supports 102a and 102b in the upward direction.

Figure 6:
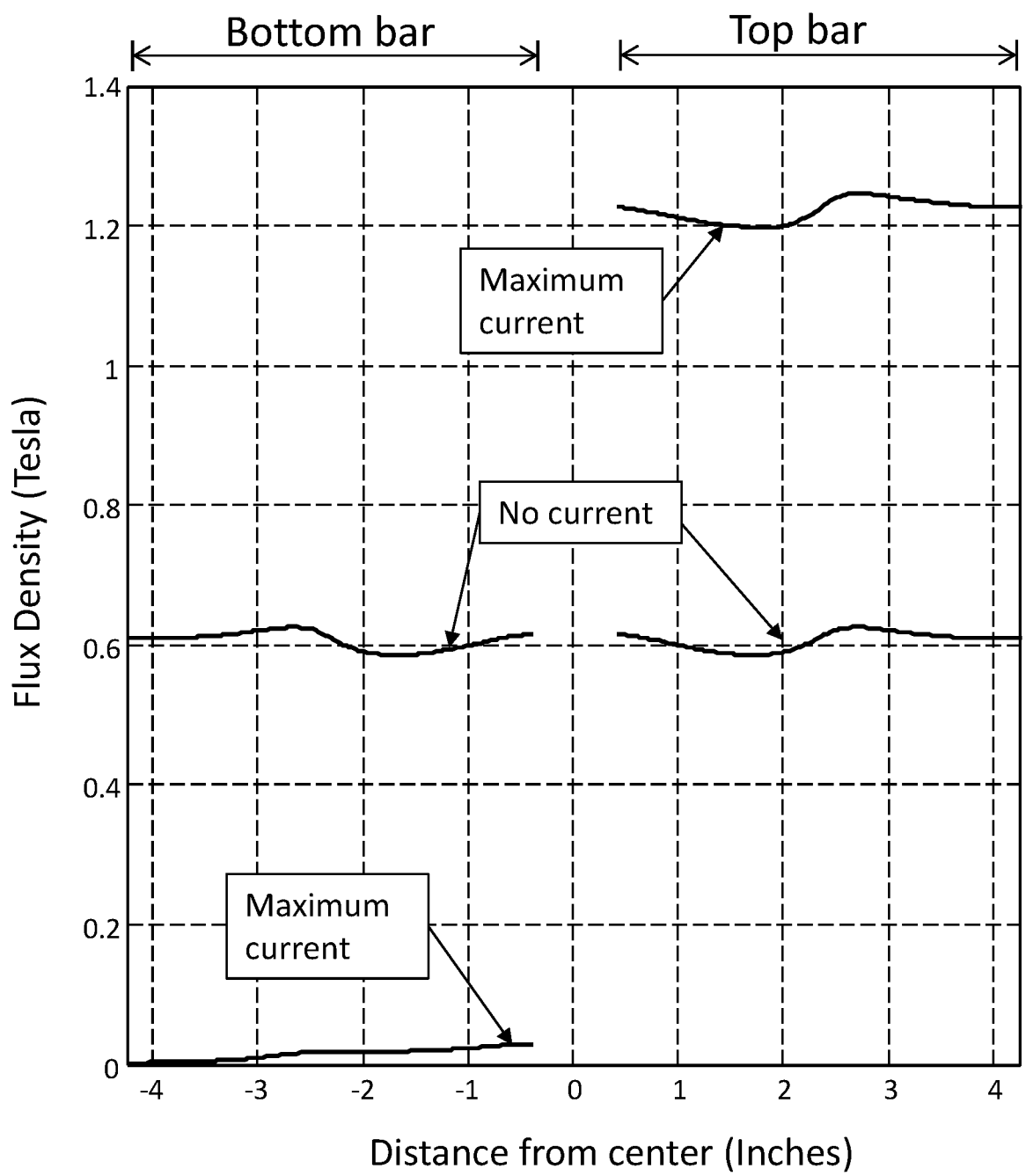
FIG. 6 is a graph showing an example of the calculated magnetic flux density for a contour line down the center of one leg at no drive current and at maximum drive current, for an inventive first-mode embodiment such as shown in FIG. 2.

FIG. 6 is a plot of the calculated flux density from the FIG. 4 and FIG. 5 examples for a vertical contour through the center of the left magnetostrictive bars 101a and 101c. It can here be seen that under condition of no current flow through the drive coils the bias flux is nearly constant at 0.6 Tesla down the length of the bars. Under condition of maximum rated current flow, the magnetic flux density in the left bottom bar 101a is nearly zero while the magnetic flux density in the left top bar 101c is about 1.2 Tesla. If the direction of current flow were reversed these flux density values would also reverse.

Figure 7B:
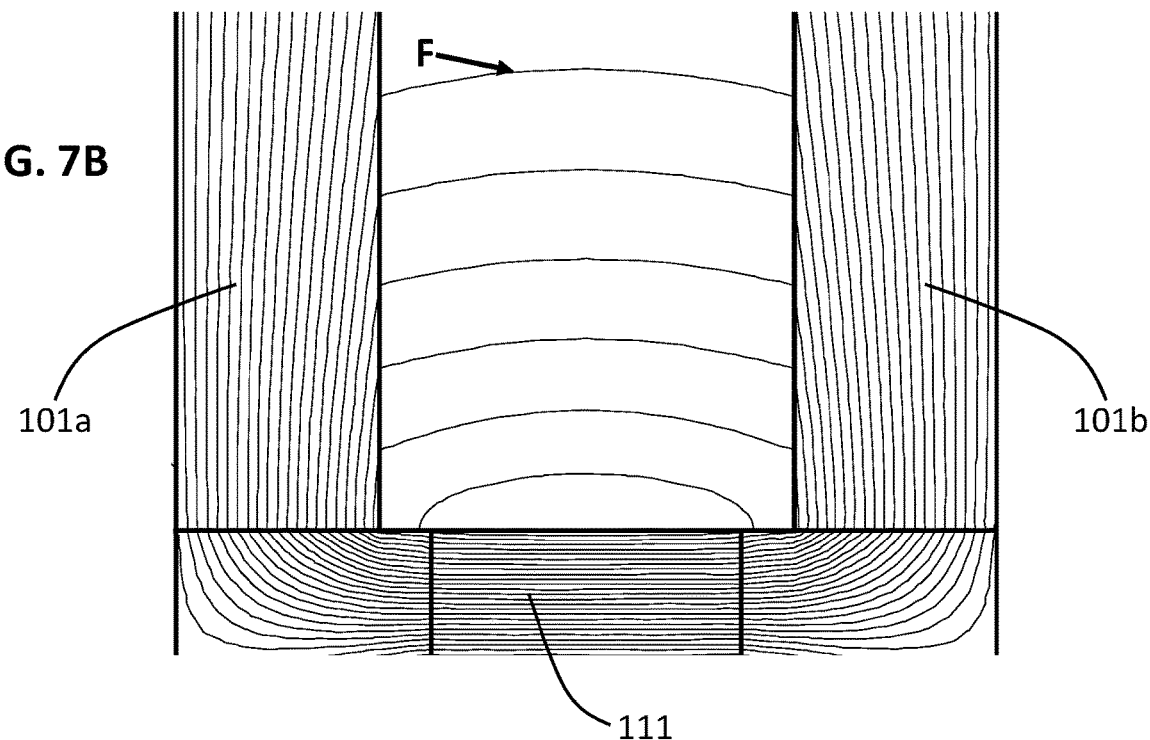
FIG. 7B is a diagram, similar to FIG. 7A, showing an example of the calculated magnetic flux lines without ferromagnetic shunts, for a portion (same portion as shown in FIG. 7A) of the inventive first-mode embodiment shown in FIG. 2.
Figure 7A:
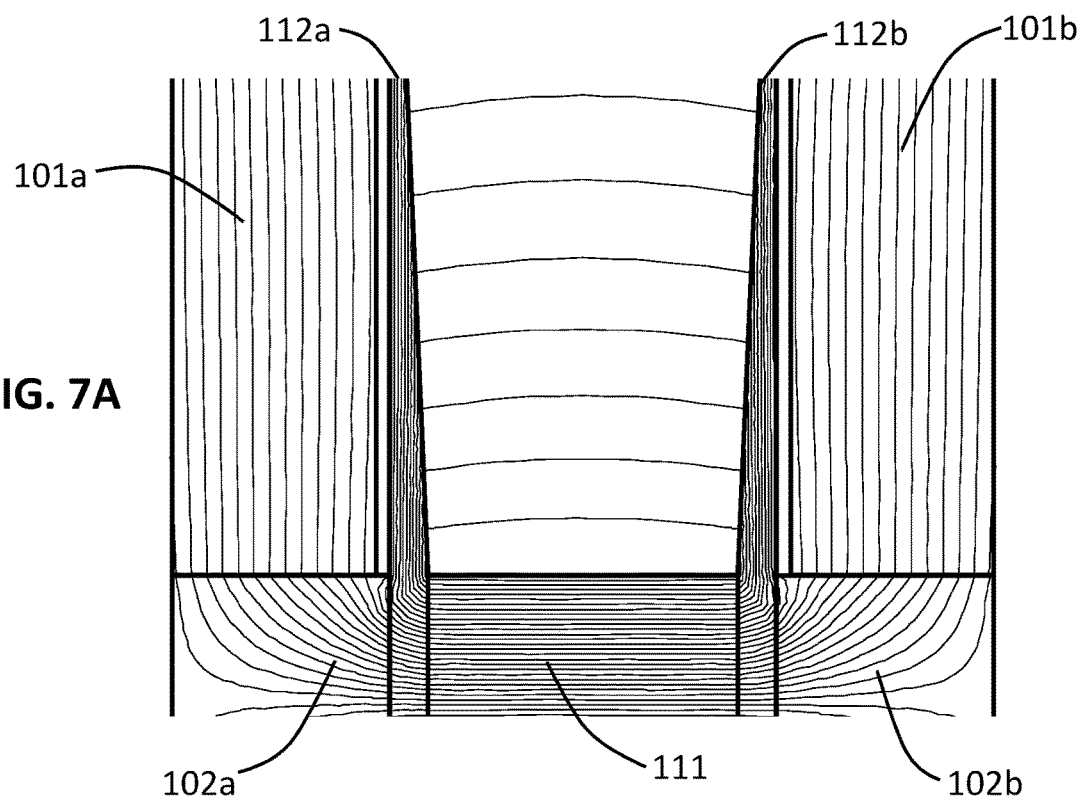
FIG. 7A is a diagram showing an example of the calculated magnetic flux lines with no drive current, for a portion of the inventive first-mode embodiment shown in FIG. 2.

FIG. 7A and FIG. 7B may be compared. FIG. 7A illustrates the calculated magnetic flux lines with no drive current for a portion of the first mode of the present invention. In contrast, FIG. 7B illustrates the calculated magnetic flux lines under the same conditions without ferromagnetic shunts 112a and 112b. Note that without the ferromagnetic shunts 112a and 112b, flux leakage between top magnetostrictive bars 101a and 101b causes the number of flux lines to reduce with distance from bias magnet 111, which indicates that the magnetic flux density is decreasing. With ferromagnetic shunts 112a and 112b in place, the number of flux lines is constant in top magnetostrictive bars 101a and 101b, indicating a uniform magnetic flux density.

In the light of the instant disclosure, the shape of ferromagnetic shunts 112a and 112b may be calculated by a person having ordinary skill in the art using a magnetic model and adjusting geometric parameters until the flux is at the desired level and within acceptable bounds of uniformity. The optimum shape of ferromagnetic shunts 112a and 112b depends upon the magnetic permeability of the magnetostrictive material and is a compromise because the permeability varies with magnetic flux level and stress. As a general guideline, a wedge with a constant taper angle and constant gap from magnetostrictive bars 101a and 101b, such as shown in FIG. 7B, provides good results for a wide range of magnetic permeability.

Figure 8:
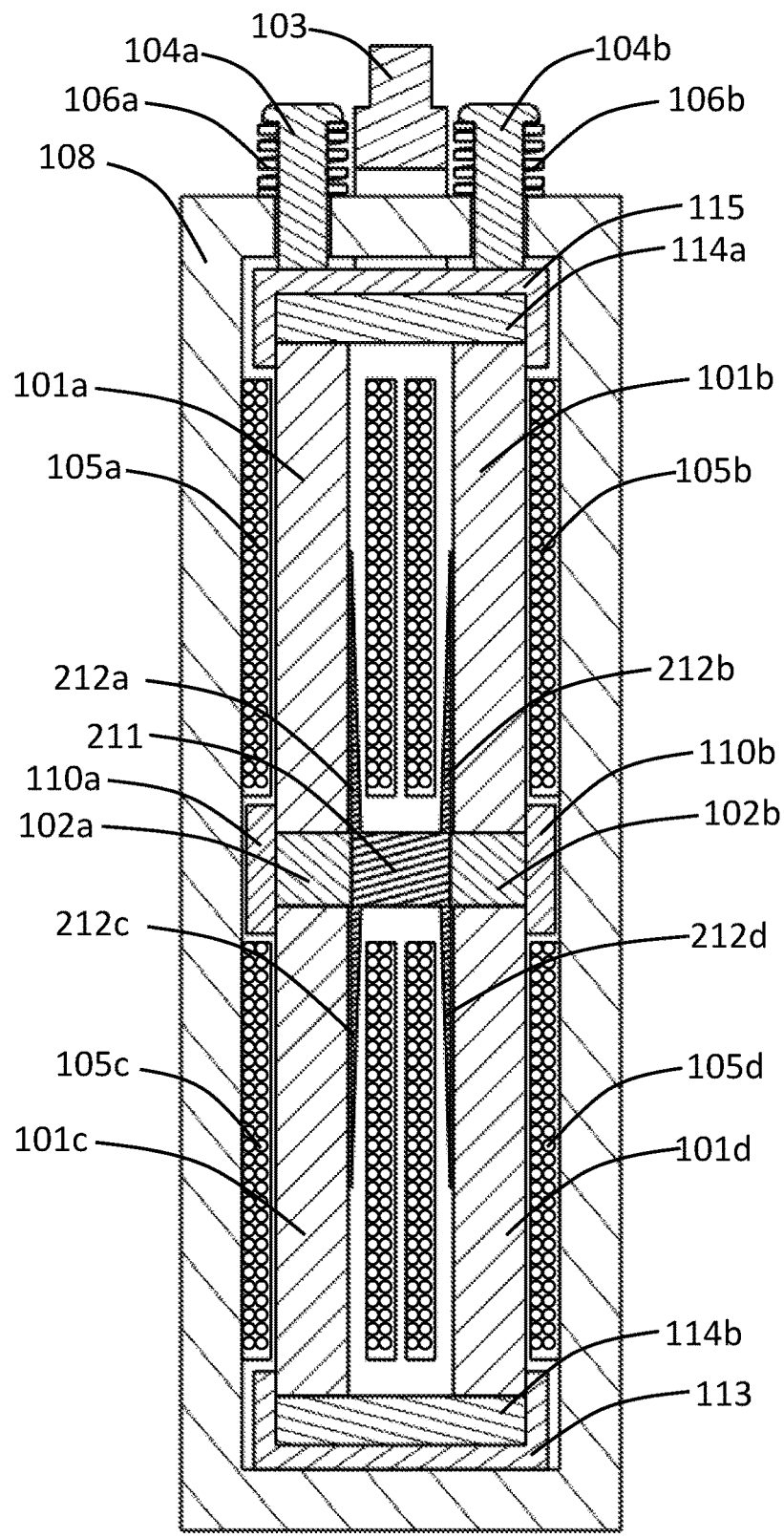
FIG. 8 is a cross-sectional view of an embodiment exemplary of the second mode of practice of the present invention.

FIG. 8 is a cross-section view of an example of the second mode of practice of the present invention. Everything remains the same as in the first mode of practice of the present invention, except that the ferromagnetic shunts 112a and 112b have been replaced with permanent magnet tapers 212a, 212b, 212c and 212d and bias magnet 111 has been replaced with bias magnet 211, which performs the same function but may be a different size. Permanent magnet tapers 212a, 212b, 212c and 212d, shown in FIG. 8, are polarized in the same direction as bias magnet 211.

Figure 9B:
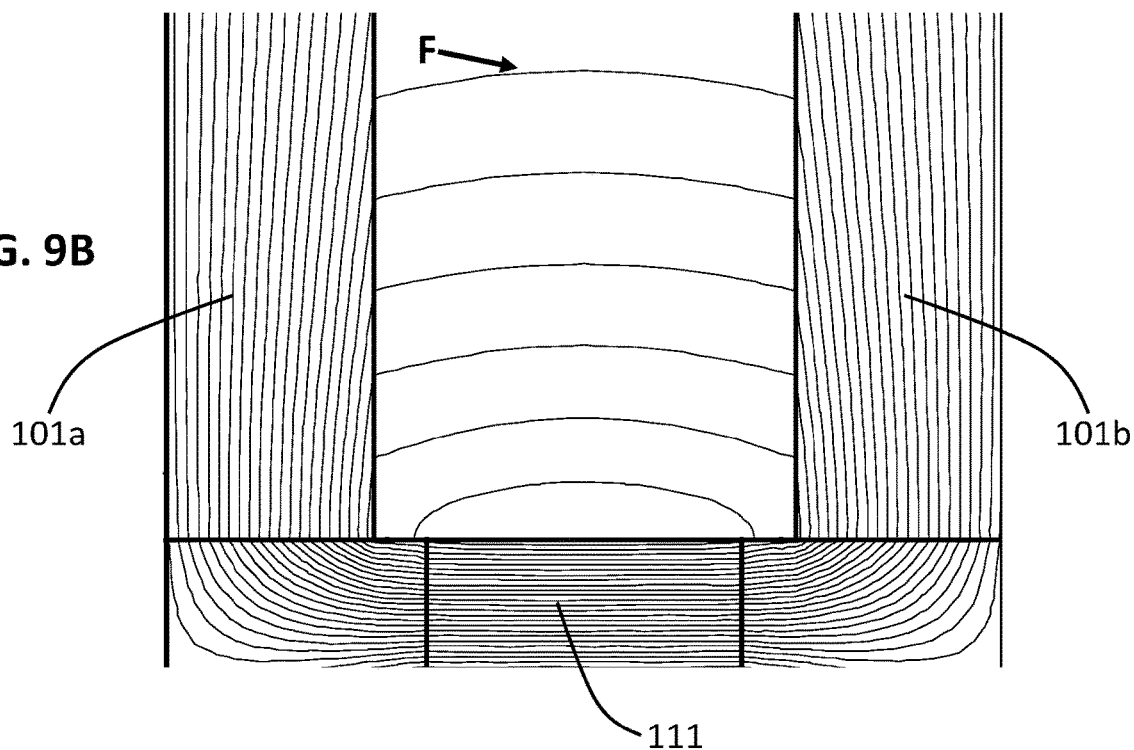
FIG. 9B is a diagram, similar to FIG. 9A, showing an example of the calculated magnetic flux lines without permanent magnet tapers, for a portion (same portion as shown in FIG. 9A) of the inventive second-mode embodiment shown in FIG. 8.
Figure 9A:
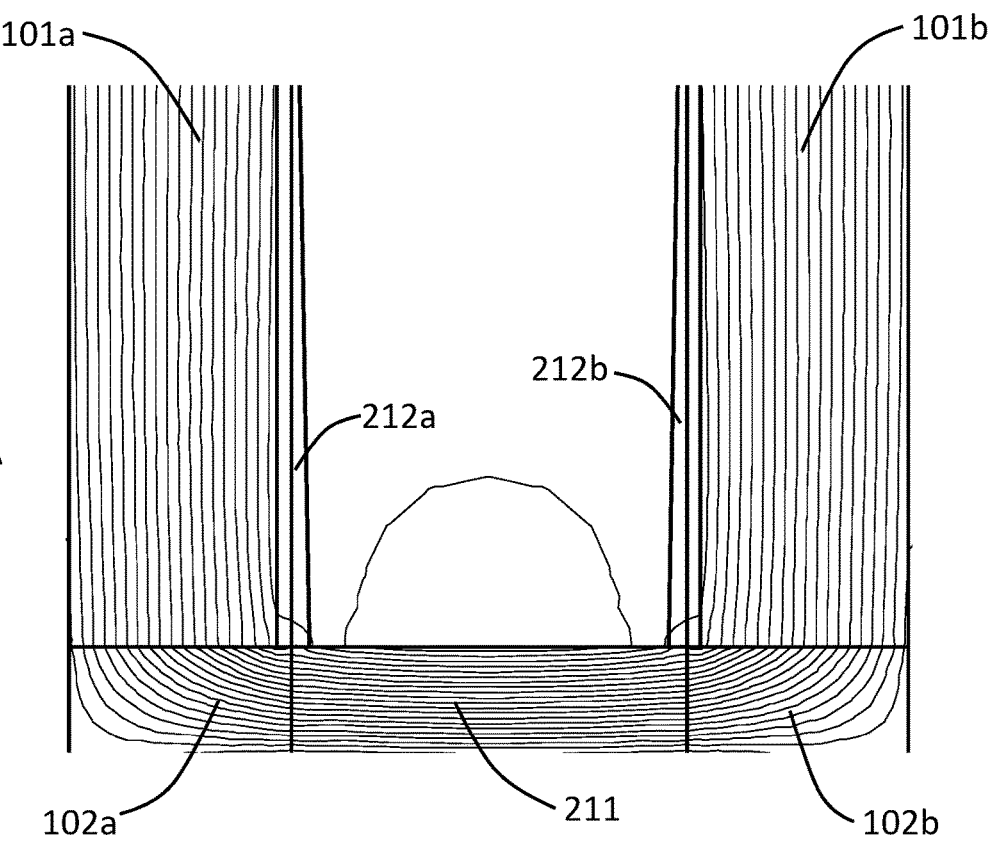
FIG. 9A is a diagram showing an example of the calculated magnetic flux lines with no drive current, for a portion of the inventive second-mode embodiment shown in FIG. 8.

FIG. 9A and FIG. 9B may be compared. FIG. 9A shows the calculated magnetic flux lines with no drive current for a portion of the second embodiment of the present invention. In contrast, FIG. 9B shows the calculated magnetic flux lines under the same conditions without permanent magnet tapers. Note that without the permanent magnet tapers, flux leakage between top magnetostrictive bars 101a and 101b causes the number of flux lines to reduce with distance from bias magnet 111, which indicates that the magnetic flux density is decreasing. With permanent magnet tapers 212a, 212b, 212c and 212d in place, the number of flux lines is constant in top magnetostrictive bars 101a and 101b, indicating a uniform magnetic flux density.

In the light of the instant disclosure, the shape of permanent magnet tapers 212a, 212b, 212c and 212d may be calculated by a person having ordinary skill in the art using a magnetic model and adjusting geometric parameters until the flux is at the desired level and within acceptable bounds of uniformity. The optimum shape of permanent magnet tapers depends upon the magnetic permeability of the magnetostrictive material and is a compromise because the permeability varies with magnetic flux level and stress. As a general guideline, a wedge with a constant taper angle and constant gap from magnetostrictive bars 101a and 101b, such as shown on FIG. 9A, provides good results for a wide range of magnetic permeability.

Figure 10:
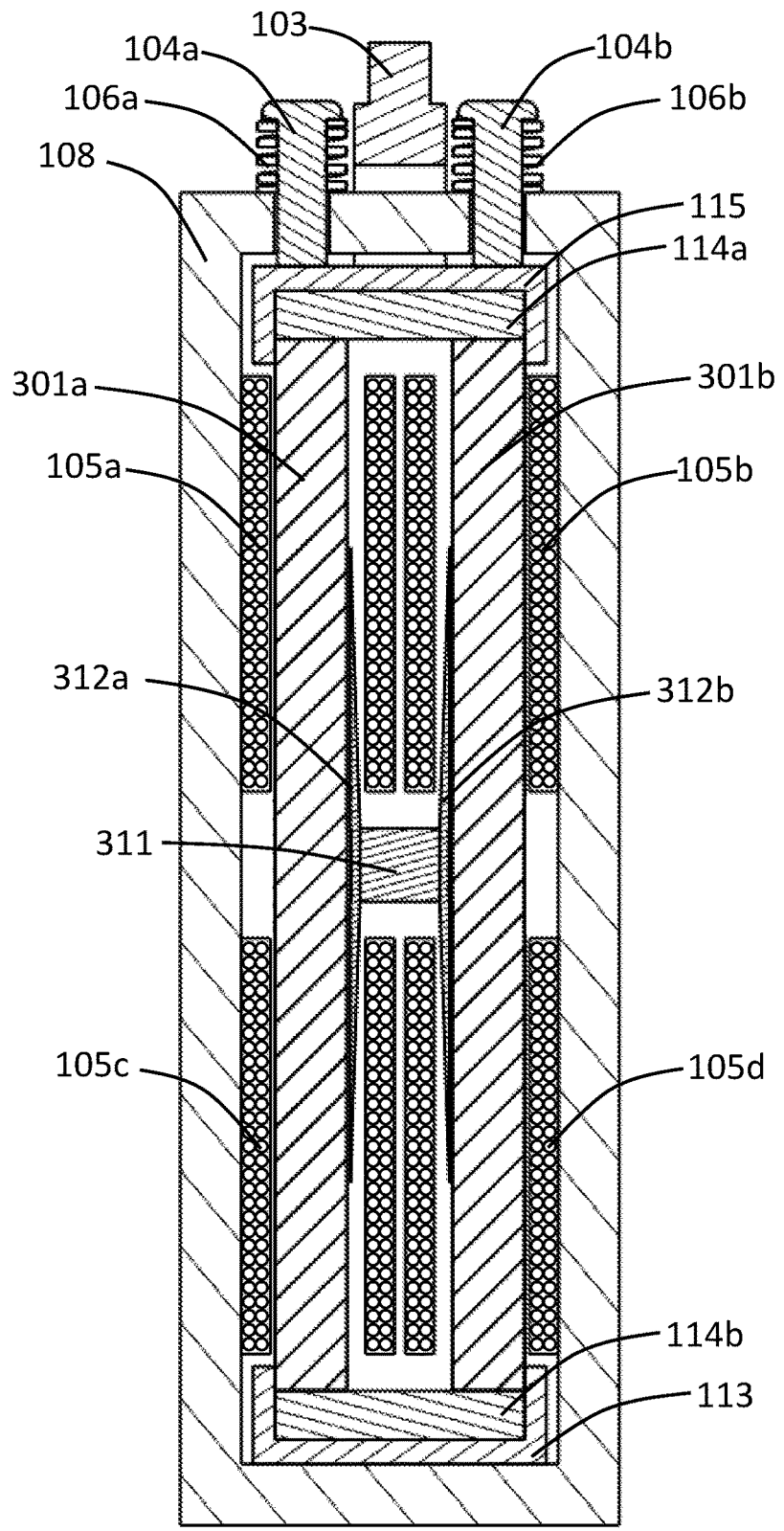
FIG. 10 is a cross-sectional view of an embodiment exemplary of the third mode of practice of the present invention.
Figure 11:
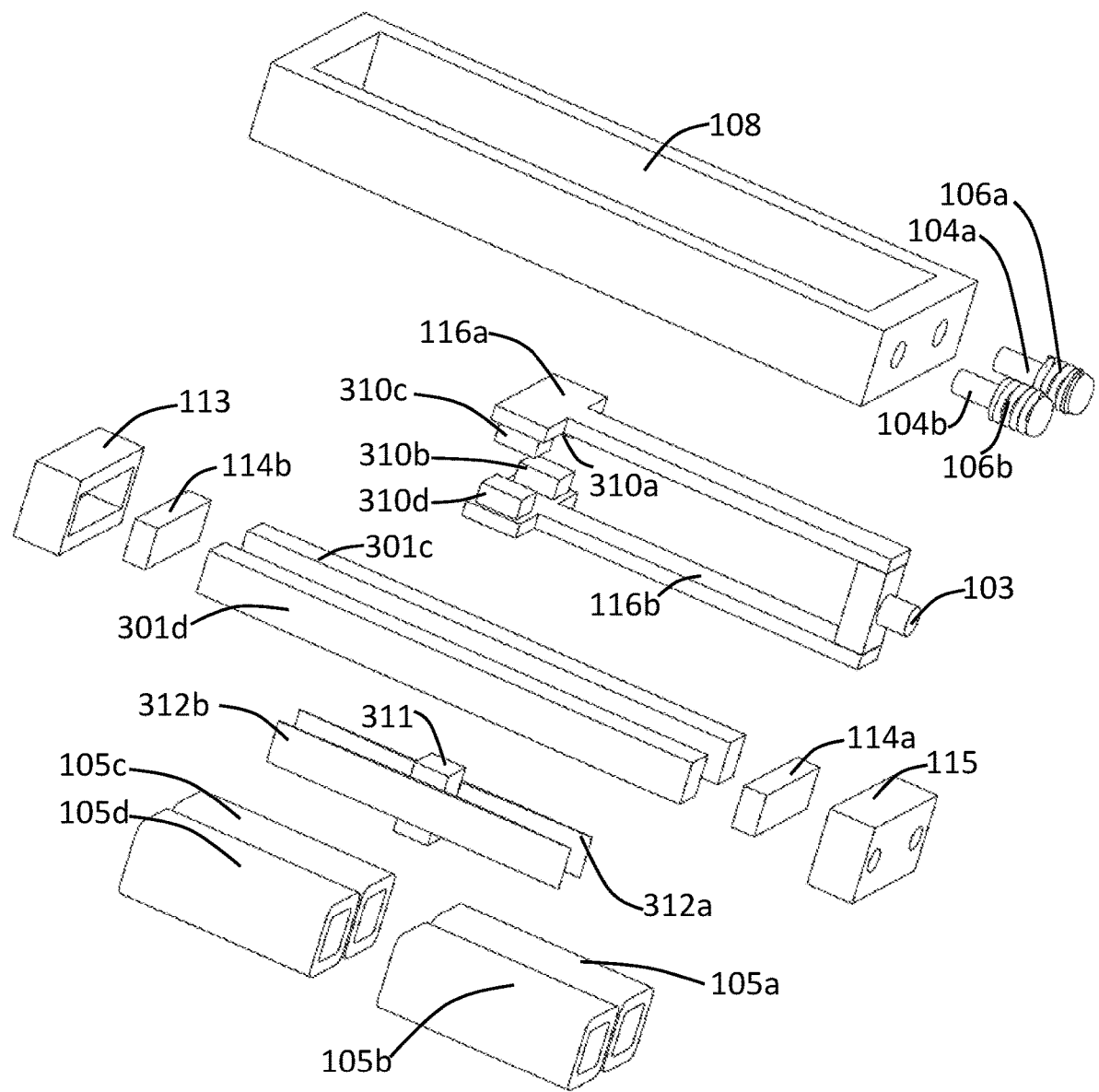
FIG. 11 is an exploded view of the inventive third-mode embodiment shown in FIG. 10.

FIG. 10 and FIG. 11 are two views of an example of the third mode of practice of the present invention. The left and right series arrangement of magnetostrictive bars in the first and second embodiments has been replaced with single left and right continuous magnetostrictive bars 301a and 301b. Center supports 110a and 110b have been replaced with center attachments 310a, 310b, 310c, and 310d that attach directly to the sides of magnetostrictive bars 301a and 301b and to output links 116a and 116b. The attachment to the magnetostrictive bars may be by bonding or welding or may be mechanical.

Figure 12:
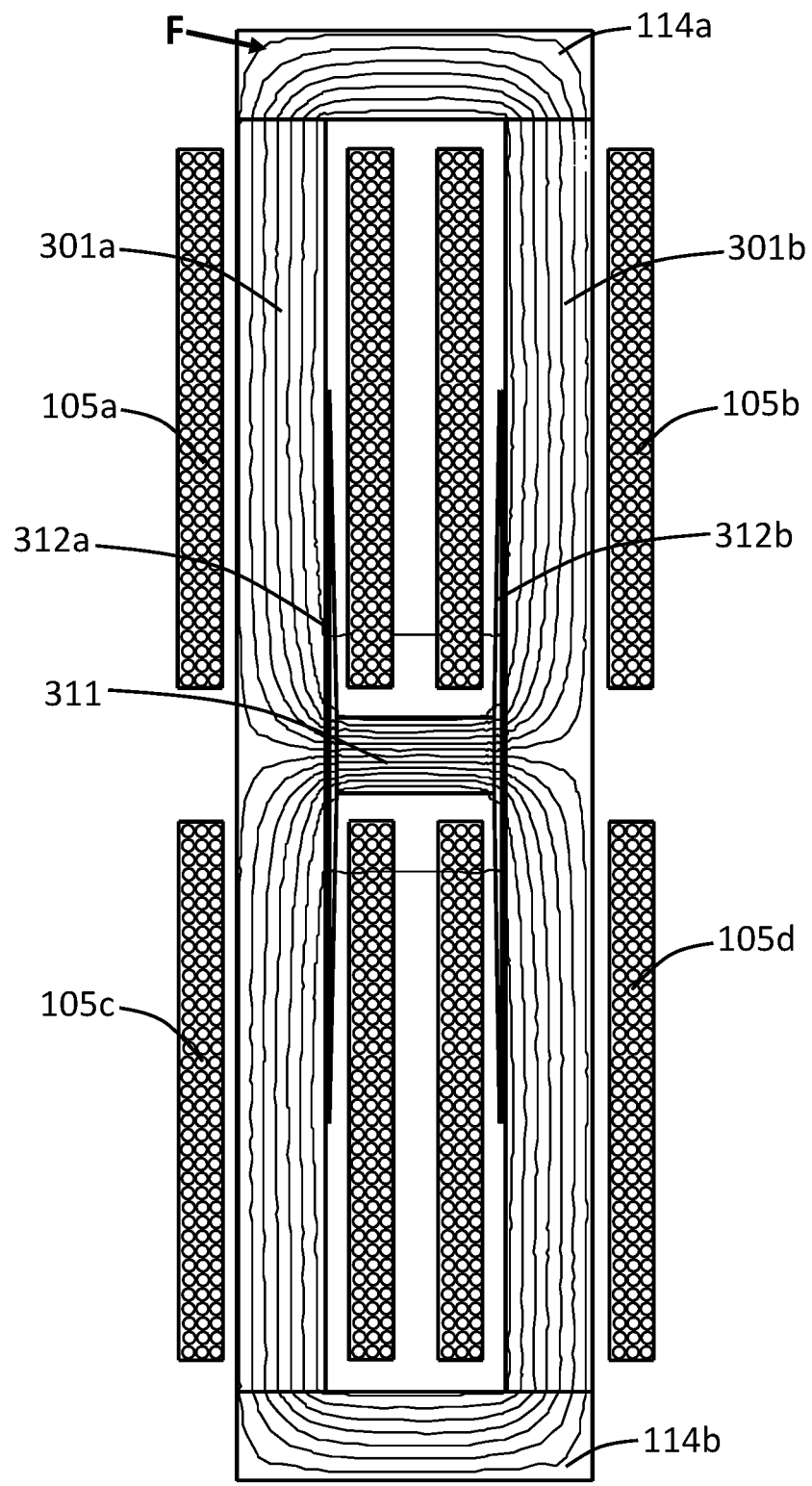
FIG. 12 is a diagram showing an example of the calculated magnetic flux lines with no drive current, for the inventive third-mode embodiment shown in FIG. 10.

FIG. 12 shows an example of a two-dimensional magnetic model of the third mode of practice of the present invention under condition of no current flow through the drive coils. The magnetostrictive material is Galfenol for the example shown in FIG. 12. The calculated magnetic flux paths are illustrated by lines F. With no drive coil current flow, all flux lines F flow from bias magnet 311 and form closed upper and lower loops back to bias magnet 311. It can be seen in FIG. 12 that the top half and the bottom half of magnetostrictive element 301a have bias flux in opposite directions from each other, and also that the top half and the bottom half of magnetostrictive element 301b have bias flux in opposite directions from each other.

Figure 13:
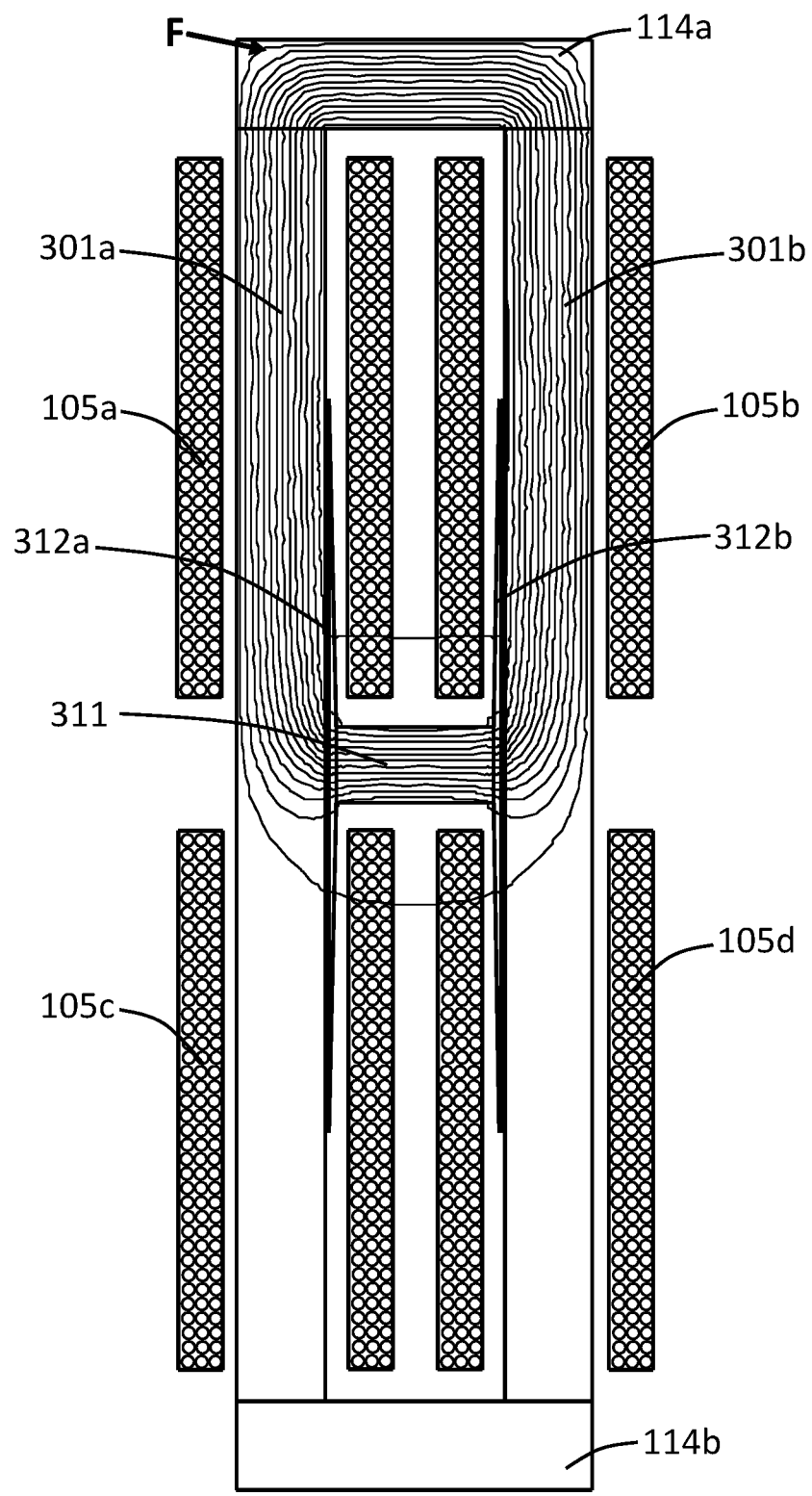
FIG. 13 is a diagram, similar to FIG. 12, showing an example of the calculated magnetic flux lines at maximum drive current, for the inventive third-mode embodiment shown in FIG. 10.

FIG. 13 shows the same two-dimensional magnetic model as FIG. 12, but under condition of maximum rated current flow through the drive coils. In the example shown in FIG. 13, the magnetic fluxes from the drive coils and from bias magnet 311 reinforce in the top halves of magnetostrictive bars 301a and 301b and cancel in the bottom halves. Thus, the top halves of magnetostrictive bars 301a and 301b elongate and the bottom halves shorten with respect to the no drive current condition, moving attachments 310a, 310b, 310c, and 310d in the downward direction. If the direction of current flow is reversed then the magnetic flux from the drive coils and from bias magnet 311 will cancel in the top halves of magnetostrictive bars 301a and 301b and reinforce in the bottom halves, moving center attachments 310a, 310b, 310c, and 310d in the upward direction.

Figure 14:
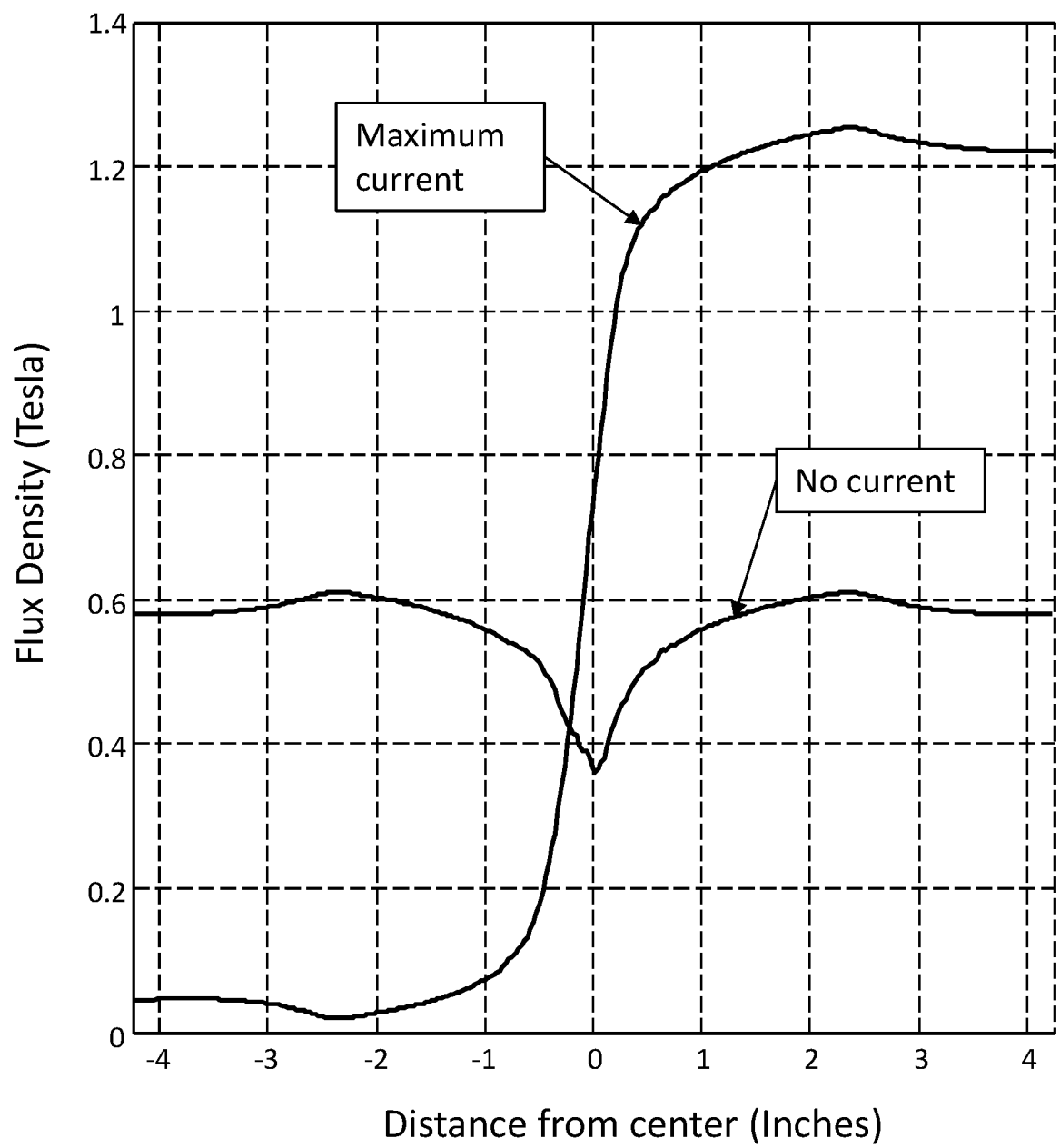
FIG. 14 is a graph showing an example of the calculated magnetic flux density for a contour line down the center of one leg at no drive current and at maximum drive current, for an inventive third-mode embodiment such as shown in FIG. 10.

FIG. 14 is a plot of the calculated flux density from the FIG. 12 and FIG. 13 examples for a vertical contour through the center of the left magnetostrictive bar 301a. It can be seen in FIG. 14 that under condition of no current flow through the drive coils the bias flux is nearly constant at 0.6 Tesla down the length of the bar except near the center. Under condition of maximum rated current flow the magnetic flux density in the bottom half of left magnetostrictive bar 301a is nearly zero while the magnetic flux density in the top half is about 1.2 Tesla. If the direction of current flow were reversed these flux density values would also reverse.

Figure 15:
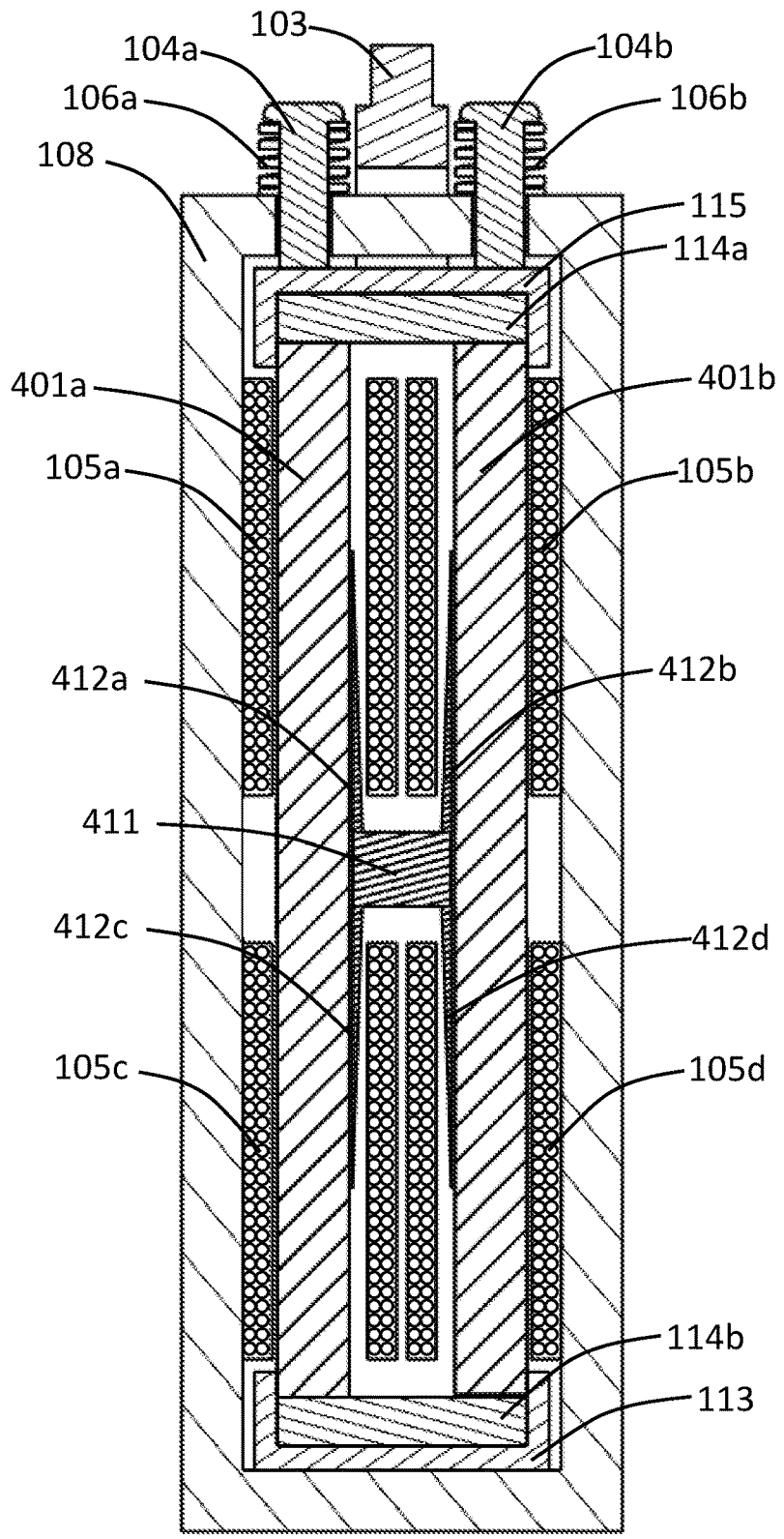
FIG. 15 is a cross-sectional view of an embodiment exemplary of the fourth mode of practice the present invention.

FIG. 15 is a cross-section view of an example of the fourth mode of practice of the present invention. Everything remains the same as in the third mode of practice of the present invention, except that the ferromagnetic shunts 312a and 312b have been replaced with permanent magnet tapers 412a, 412b, 412c and 412b, and bias magnet 311 has been replaced with bias magnet 411, which performs the same function but may be a different size. Permanent magnet tapers 412a and 412b are polarized in the same direction as bias magnet 411.

The present invention, which is disclosed herein, is not to be limited by the embodiments described or illustrated herein, which are given by way of example and not of limitation. Other embodiments of the present invention will be apparent to those skilled in the art from a consideration of the instant disclosure, or from practice of the present invention. Various omissions, modifications, and changes to the principles disclosed herein may be made by one skilled in the art without departing from the true scope and spirit of the present invention, which is indicated by the following claims.

What is claimed is:

1. A magnetostriction-based actuator comprising:
   two parallel linear magnetostrictive units;
   at least two ferromagnetic end members joining the linear magnetostrictive units at the upper and lower ends respectively of the linear magnetostrictive units;
   a magnetic unit situate between the parallel linear magnetostrictive units and intermediate the upper and lower respective ends of the linear magnetostrictive units; and
   two pairs of separate coaxial drive coils, each pair of drive coils partially encircling a different one of the linear magnetostrictive units;
   wherein upper and lower magnetic flux circuits are associated with connection of the magnetic unit to upper and lower portions respectively of the linear magnetostrictive units; and
   wherein magnetic flux manifestations associated with electrification of the two pairs of drive coils combine with the upper and lower magnetic flux circuits so as to augment one of the magnetic flux circuits and at least substantially neutralize the other of the magnetic flux circuits.

2. The magnetostriction-based actuator of claim 1, wherein augmentation of a magnetic flux circuit is associated with increase in length of the corresponding portions of the linear magnetostrictive units, and wherein at least substantial neutralization of a magnetic flux circuit is associated with decrease in length of the corresponding portions of the linear magnetostrictive units.

3. The magnetostriction-based actuator of claim 1, wherein each of the linear magnetostrictive units includes a magnetostrictive bar having an upper end and a lower end, and wherein the magnetic unit includes a magnet connected to each magnetostrictive bar.

4. The magnetostriction-based actuator of claim 1, wherein:
   each of the linear magnetostrictive units includes an upper magnetostrictive bar and a lower coaxial magnetostrictive bar;
   the magnetic unit includes a magnet and two ferromagnetic intermediate members connected to the magnet on opposite sides of the magnet;
   one of the ferromagnetic intermediate members is connected between the upper and lower magnetostrictive bars of one of the linear magnetostrictive units;
   the other of the ferromagnetic intermediate members is connected between the upper and lower magnetostrictive bars of the other of the linear magnetostrictive units.

5. The magnetostriction-based actuator of claim 1, further comprising two flux leakage compensation units, one of the flux leakage compensation units coupled with one of the linear magnetostrictive units, the other of the flux leakage compensation units coupled with the other of the linear magnetostrictive units.

6. The magnetostriction-based actuator of claim 5, wherein each of the flux leakage compensation units includes at least one ferromagnetic shunt.

7. The magnetostriction-based actuator of claim 5, wherein each of the flux leakage compensation units includes at least one magnetic taper.

8. A magnetostrictive actuator comprising:
   two parallel magnetostrictive structures;
   a central permanent magnetic structure interposed between and contacting said two parallel magnetostrictive structures;
   two ferromagnetic structures respectively connecting said two parallel magnetostrictive structures at respective upper ends and at respective lower ends of said two parallel magnetostrictive structures;
   a first pair of coaxial drive coils separated from each other and surrounding upper and lower portions respectively of a first said magnetostrictive structure;
   a second pair of coaxial drive coils separated from each other and surrounding upper and lower portions respectively of a second said magnetostrictive structure;
   wherein an upper closed magnetic flux conducting loop is formed by said central permanent magnetic structure, respective said upper portions of said two parallel magnetostrictive structures, and the upper said ferromagnetic structure;
   wherein a lower closed magnetic flux conducting loop is formed by said central permanent magnetic structure, respective said lower portions of said two parallel magnetostrictive structures, and the lower said ferromagnetic structure;
   wherein magnetic fluxes resulting from application of drive current to said first and second pairs of said drive coils reinforce one of said upper closed magnetic flux conducting loop and said lower closed magnetic flux conducting loop, and at least substantially cancel the other of said upper closed magnetic flux conducting loop and said lower closed magnetic flux conducting loop.

9. The magnetostrictive actuator of claim 8, wherein the respective said portions of said two parallel magnetostrictive structures that are in the reinforced said closed magnetic flux conducting loop lengthen, and the respective said portions of said two parallel magnetostrictive structures that are in the at least substantially canceled said closed magnetic flux conducting loop shorten.

10. The magnetostrictive actuator of claim 9, wherein each of said two parallel magnetostrictive structures is made of Galfenol.

11. The magnetostrictive actuator of claim 9, wherein each of said two parallel magnetostrictive structures is a linear elongate structure.

12. The magnetostrictive actuator of claim 9, wherein said magnetic structure is medially interposed between said two parallel magnetostrictive structures.

13. The magnetostrictive actuator of claim 9, further comprising at least one magnetic taper for providing compensation for flux leakage, each said magnetic taper associated with one of said two parallel magnetostrictive structures.

14. The magnetostrictive actuator of claim 9, further comprising at least one ferromagnetic shunt for providing compensation for flux leakage, each said ferromagnetic shunt associated with one of said two parallel magnetostrictive structures.

* * * * *